United States Patent
Huang

(10) Patent No.: US 6,309,257 B1
(45) Date of Patent: Oct. 30, 2001

(54) SEALED, WATER-PROOF HOUSING FOR AN ELECTRICAL DEVICE

(75) Inventor: Peter K. H. Huang, Taipei (TW)

(73) Assignee: Shining Blick Enterprises Co., Ltd., Taipei (TW)

( * ) Notice: Subject to any disclaimer, the term of this patent is extended or adjusted under 35 U.S.C. 154(b) by 0 days.

(21) Appl. No.: 09/635,976

(22) Filed: Aug. 9, 2000

(51) Int. Cl.⁷ .................................................. H01R 13/514
(52) U.S. Cl. .......................................... 439/731; 174/50.5
(58) Field of Search ........................... 439/731, 936, 439/556, 559, 562; 220/4.02; 174/50.5, 52.3, 53

(56) References Cited

U.S. PATENT DOCUMENTS

| | | | | |
|---|---|---|---|---|
| 3,149,747 | * | 9/1964 | Burgess | 220/4.02 |
| 3,307,603 | * | 3/1967 | Swett | 220/783 |
| 5,111,362 | * | 5/1992 | Flamm et al. | 361/395 |
| 5,310,075 | * | 5/1994 | Wyler | 220/355 |
| 5,562,338 | * | 10/1996 | Yamamoto | 362/61 |
| 5,670,109 | * | 9/1997 | DeRees | 264/261 |
| 5,782,370 | * | 7/1998 | Kamiya | 220/4.02 |
| 6,059,483 | * | 5/2000 | Owens et al. | 403/267 |
| 6,089,910 | * | 7/2000 | Suzuki et al. | 439/559 |

* cited by examiner

*Primary Examiner*—Brian Sircus
*Assistant Examiner*—Hae Moon Hyeon
(74) *Attorney, Agent, or Firm*—Dougherty & Troxell

(57) ABSTRACT

A housing for electric appliances and an electric connecting device thereof, the housing is combined as a box from two confronting parts, in combining the confronting parts, a glue passage is formed at the junction zone of the confronting parts by primary positioning; at least an injection port and an outlet in opposition to the injection port are provided on the combining parts to communicate with the glue passage, pressure is exerted to press glue via the injection port into and fully fill in the glue passage on the housing to fast complete assembling and sealing operation of the housing. The box is provided at least on one side thereof with an electric connecting device which is provided with an exposed input terminal and an output terminal.

4 Claims, 4 Drawing Sheets

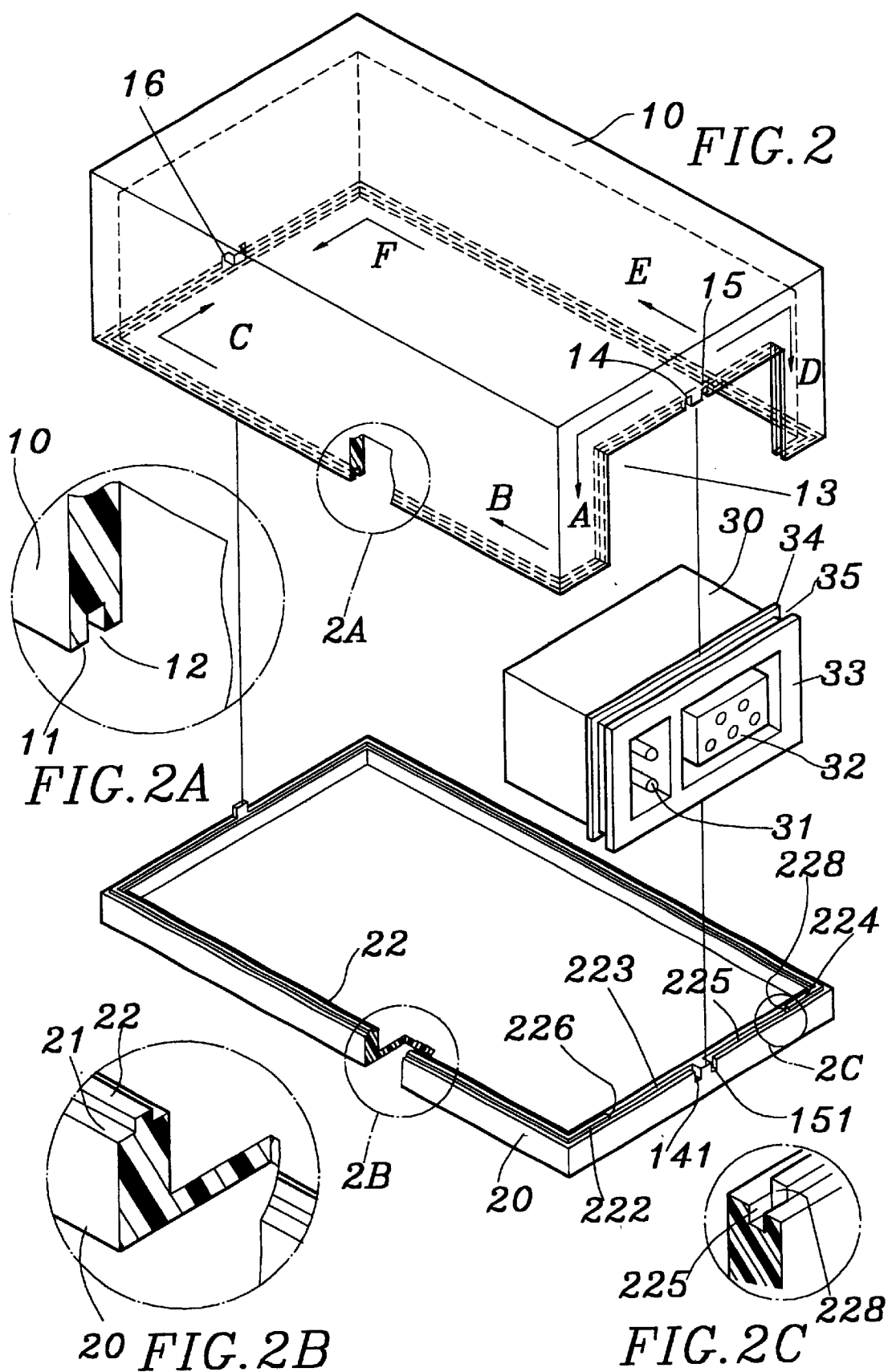

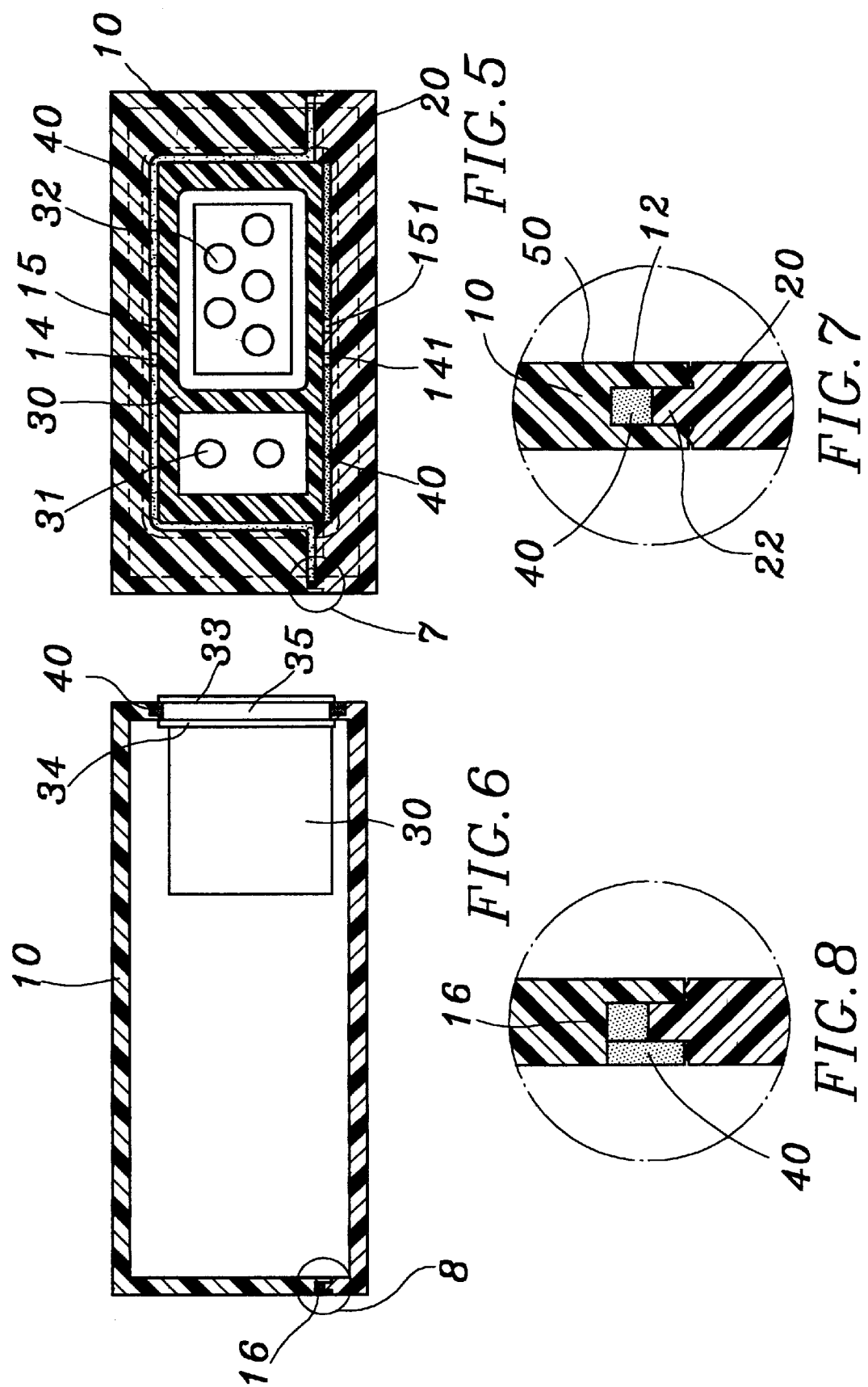

SEALED, WATER-PROOF HOUSING FOR AN ELECTRICAL DEVICE

BACKGROUND OF THE INVENTION

1. Field of the Invention

The present invention is related to a housing for electric appliances and an electric connecting device thereof, and especially to a housing for electric appliances such as a transformer, a control box etc. for decorative lamps, the housing can be provided with a tight sealing and waterproof function after quick assembling.

2. Description of the Prior Art

Structures and modeling of modern decorative lamps has been having quite a large change. As for a conventional lamp string, it is only that a lot of lamp bulbs are provided on a pair of conductors, and it gives a kind of monotonic illumination and a decorative effect of shining. It is more troublesome and untidy to wrap such a conventional lamp string on an article to be decorated (such as a Christmas tree), and it is cumbersome to take the lamp string off. A net light disclosed in the U.S. Pat. No. 5,662,409 can not only have the advantage of fast and convenient assembling, but also can provide a two-dimensional decorative function, the net light can provide various modes of shining under control of an electric circuit. To control the whole operational function of the net light (such as to control changes of the modes of shining), certainly an electric control box is used.

And more, the decorative lamps available now include a strip like lamp which can provide the effect of a neon light, such a strip like lamp can not only be bent in pursuance of a pattern, but can also be cut into specific lengths according to demand. Such strip like lamp is called fitting light or lighting rope system, or is called cabled lamp. Fundamentally, it includes a plurality of lamp strings provided in a transparent or semi-transparent flexible pipe. The whole strip lamp can be rolled up in addition to that it can be bent and positioned to form a desired pattern; it can be cut down in sections according to demand. The internal lamp strings provided in the strip lamp generally use DC voltage, thereby, they generally are used for the 110V or 220V power sources by aiding of control boxes for transformers.

A decorative lamp with a housing for electric appliances such as the above stated control box, transformer or a lamp holder generally is used outdoors, hence it is essential for safety to provide a tight sealing and waterproof function for such a housing. Therefore, such housing for electric appliances formed ordinarily from confronting parts of the housing must be provided with a leakage-proof structure and its related accessories (such as a leakage-proof gasket etc.). However, manufacturing and assembling of such housing is very cumbersome and inconvenient. Moreover, by virtue that such housing is provided with conductors for connecting parts outside of it, the conductors shall be pulled to extend out of the housing, the leakage-proof structure at the connection of the conductors with the housing becomes also a trouble in operation.

SUMMARY OF THE INVENTION

The primary object of the present invention is to provide a housing for electric appliances and an electric connecting device thereof. The housing for electric appliances, such as an electric control box, can be combined from two confronting parts of the housing, these confronting parts are combined and positioned primarily by supersonic wave or thread connecting mode, during the primary combining, a glue passage is formed at the connecting area of these confronting parts, and at least an injection port and an outlet are provided on the confronting parts to inject glue for adhering, so that the electric connecting device and the confronting parts can quickly and conveniently form a well sealed box without providing any leakage-proof accessory or related structure.

Another object of the present invention is to simultaneously assemble and position the electric connecting device when in combining the housing for an electric appliance, so that conductors for the housing of the appliance are not restrained by aiding of the electric connecting device and can be continuously connected for further extending. The electric connecting device and the confronting parts can form the injection port for injecting glue in cooperation with the abovementioned glue passage when in combining.

The present invention will be apparent in its novelty and features after reading the detailed description of the preferred embodiment thereof in reference to the accompanying drawings.

BRIEF DESCRIPTION OF THE DRAWINGS

FIG. 2 is an exploded perspective view showing the elements in FIG. 1;

FIG. 2A is an enlarged view of area 2A in FIG. 2;

FIG. 2B is an enlarged view of area 2B in FIG. 2;

FIG. 2C is an enlarged view of area 2C in FIG. 2;

FIG. 5 is a sectional view showing connection of the electric connecting device with the housing of FIG. 1;

FIG. 6 is a sectional side view taken from FIG. 5;

FIG. 7 is a partial enlarged sectional view taken from FIG. 5;

FIG. 8 is a partial enlarged sectional view taken from FIG. 6 at a junction of the housing.

DETAILED DESCRIPTION OF THE PREFERRED EMBODIMENT

Figure 1:
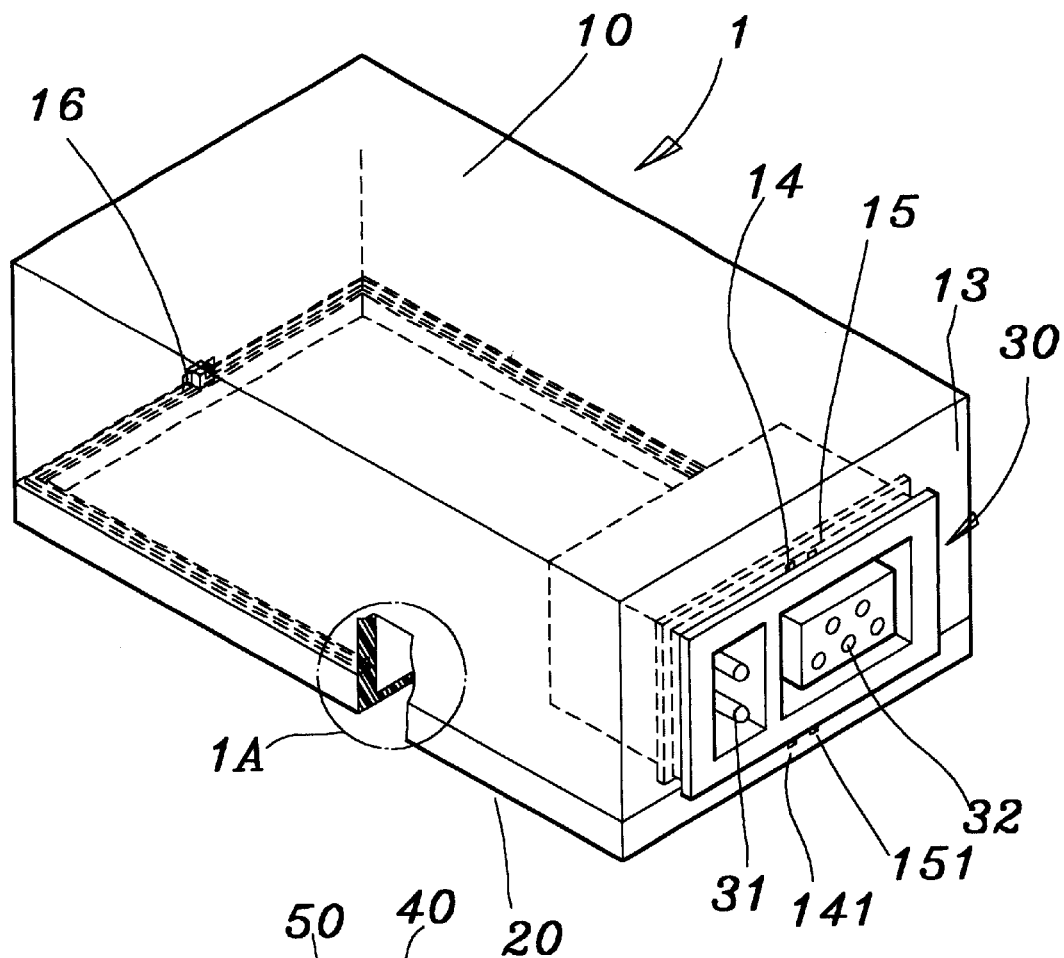
FIG. 1 is a perspective view showing the structure of a preferred embodiment of the present invention having been combined using glue, wherein, an enlarged drawing is depicted for one of the confronting parts.
Figure 1A:
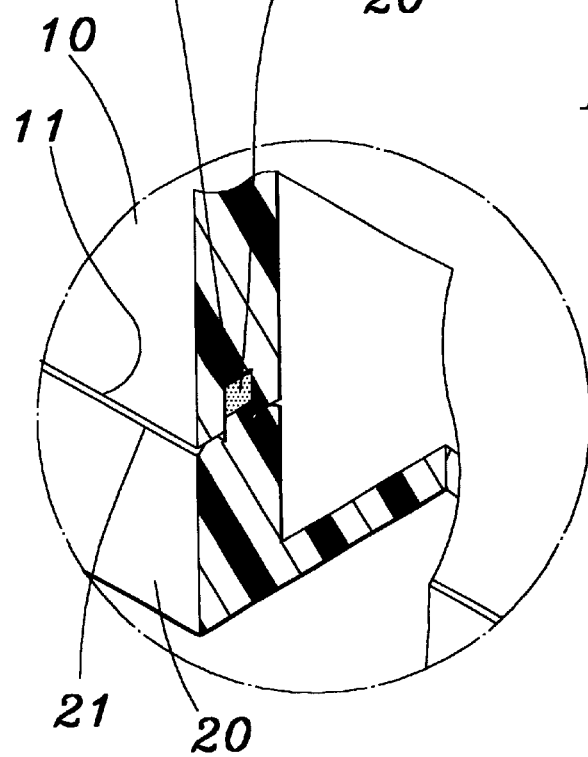
FIG. 1A is an enlarged view of area 1A in FIG. 1.

Referring to FIGS. 1 and 1A, an electric control box 1 for electric appliances, as an example, is provided with confronting parts 10, 20 of its housing. In this embodiment, the electric control box 1 for electric appliances is provided on one side thereof with an electric connecting device 30 having an exposed input terminal 31 and an output terminal 32.

A primary object of the present invention is that, at the connecting edges 11, 21 respectively, of the confronting parts 10, 20 (referring to the enlarged drawing depicted in FIG. 1), primary positioning can be performed to render the junction area of the confronting parts 10, 20 to form a glue passage 50 to allow filling therein glue 40.

The primary positioning can be done by any suitable mode of processing. In the embodiment shown, as an example, connecting at the junction area between the confronting parts 10, 20 is done by supersonic wave mode. The primary positioning can also be performed by other screw connection or engagement.

In the preferred embodiment shown in FIG. 1 (and also referring to FIG. 2), the confronting part 10 is provided at the junction area 11 thereof with a groove 12 of a predetermined depth, the other confronting part 20 is provided at the connection edge 21 thereof with a protruding strip 22 in opposition to the groove 12, the height of protrusion of the protruding strip 22 is smaller than the depth of groove 12. Thereby, when the confronting parts 10, 20 at the connection edges 11, 21 get close to each-other to make entering of the protruding strip 22 into the groove 12, the glue passage 50 is formed by the fact that the height of protrusion of the protruding strip 22 is smaller than the depth of groove 12.

If the electric control box 1 for electric appliances only has its conductors led out and has no other exposed accessories (such as an electric connecting device), the whole box 1 is provided with an injection port and an outlet, thereby a glue filling device with set pressure can be used to press glue via the injection port into the above stated glue passage 50 to fast assemble the box 1 by connecting with glue, and a desired tight sealing and waterproof function can be obtained. The operation of connecting does not need any leakage-proof accessory or related sealing structure (such as a leakage-proof gasket etc.), manufacturing of the present invention can be faster, more convenient and can get a reliable sealing function.

When the electric control box 1 for electric appliances is provided with other functional accessories, there is an electric connecting device 30 in the embodiment shown, the electric control box 1, an input terminal 31 and an output terminal 32 are provided on the electric control box 1. The electric connecting device 30 has an advantage, that is, decorative lamps such as strip like lamps can be continuously connected for further extending. In the embodiment shown, the electric connecting device 30 is mounted on one side of the electric control box 1. And as shown in FIG. 2, the electric connecting device 30 is provided, in addition to the input terminal 31 and the output terminal 32 on the end surface thereof, with a front clamping sheet 33 and a rear clamping sheet 34 with a peripheral groove 35 formed therebetween.

In cooperation with the electric connecting device 30, the confronting parts 10, 20 together form an opening on the end side thereof for mounting the electric connecting device 30. In the embodiment shown, one part 10 of the confronting parts 10, 20 is provided on the end side thereof with a notch 13 with an inverted U-shape at the above mentioned opening for mounting the electric connecting device 30. The groove 12 at the connection edge 11 at the bottom of the confronting part 10 for forming the glue passage 50 also extends to the notch 13, and two injection ports 14, 15 are extended inwards from the external surface of the notch 13 at an upper position. The peripheral groove 35 of the electric connecting device 30 can cooperatively be straddled by and engaged with the edges of the notch 13 (referring to FIG. 4). The other part 20 of the confronting parts 10, 20 is also provided on the end side thereof with protruding strips 222, 224 (referring to FIGS. 2, 3) for forming the glue passage 50. The protruding strips 222, 224 are integral with the protruding strip 22 of the part 20 of the confronting parts, but they are cut short to form stop end faces 226, 228 to fit the width of the electric connecting device 30. The section between the stop end faces 226, 228 is further excavated to form recessed passages 223, 225 which respectively stop at positions near the medium position of the end side; at these lower positions, two more injection ports 141, 151 are provided. The injection ports 141, 151 orthogonally communicate with the recessed passages 223, 225 at the surface of the end side.

Figure 4:
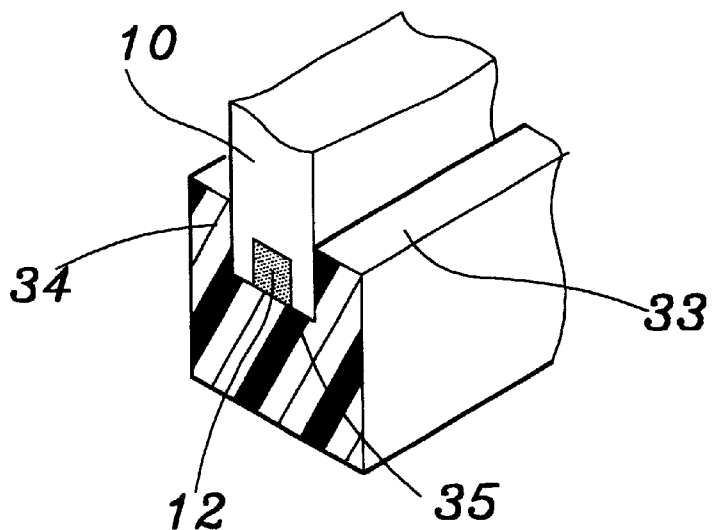
FIG. 4 is a perspective view showing connection of the upper edge of the electric connecting device with the other of the confronting parts.
Figure 3:
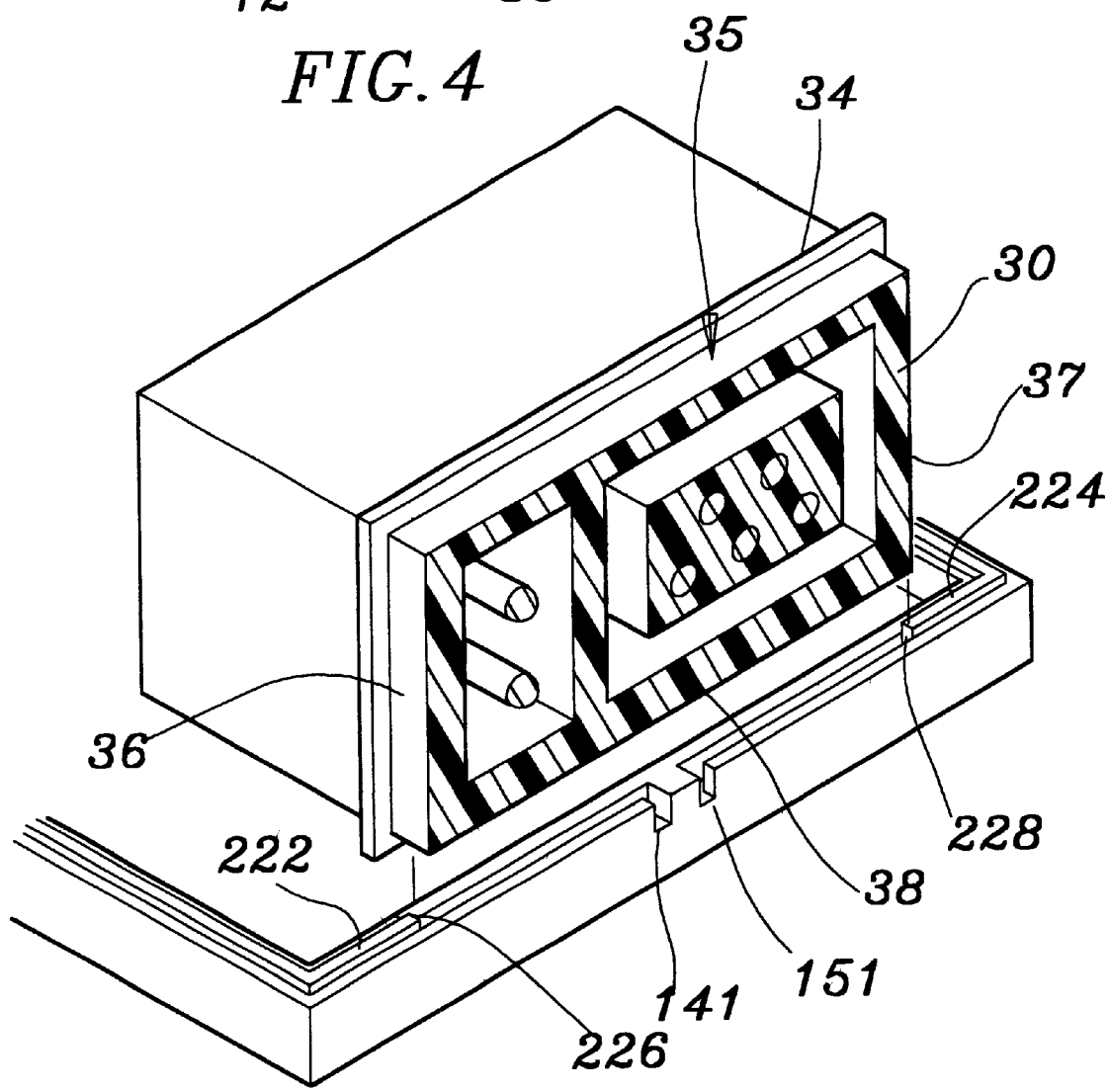
FIG. 3 is a perspective view showing connection of the lower edge of the electric connecting device with one of the confronting parts.

As shown in FIGS. 3 and 4, when the electric connecting device 30 is mounted in the opening formed from the confronting parts 10, 20, the upper end and the two lateral sides thereof are engaged in the notch 13 of the confronting part 10 as mentioned above, while the bottom edge thereof is interposed between the cut short protruding strips 222 and 224 as is shown in FIG. 3. The lower portions of two lateral sides 36, 37 of the abovementioned peripheral groove 35 are respectively abutted against the stop end faces 226, 228, so that a bottom edge of the electric connecting device 30 is pressed to be placed on the top surface of the recessed passages 223, 225.

As shown in FIG. 1, 2 and 5–8, glue injection procedure for the housing of the electric control box 1 for electric appliances having been primarily positioned includes the steps: the injection ports 14, 15 are used to fill in glue 40 by pressure, so that as is shown in FIG. 2, the glue 40 is injected on one side via the glue passage 50 to get in along the arrows A, B and C till the outlet 16 in remote opposition to the injection ports 14, 15; and is injected on the other side also via the glue passage 50 to get in along the arrows D, E and F till the same outlet 16. Then glue is filled in via additional injection ports 141, 151 to get into the recessed passages 223, 225 to complete the whole sealing operation.

The present invention makes assembling and sealing of a transformer or a control box for decorative lamps faster and more convenient and thus is more suitable for mass production. And more, when the housing for electric appliances includes exposed conductors, it can also obtain the effects of easy working, reliable sealing and connecting, preventing water leakage when it is used outdoors, and higher safety is obtained by the same technique thereof. And it can be mounted simultaneously with the electric connecting device 30 as disclosed in the aforesaid embodiment, such technique can also be used in the housing for electric appliances such as a lamp holder, and thus the present invention is highly industrial valuable.

The embodiment cited above is only for illustrating a preferred embodiment of the present invention. It will be apparent to those skilled in this art that various modifications or changes can be made to the elements of the present invention without departing from the spirit and scope of this invention. Accordingly, all such modifications and changes also fall within the scope of the appended claims and are intended to form part of this invention.

What is claimed is:

1. A sealed water-proof housing for an electrical device comprising:

a) a first confronting housing part having a first connecting edge with a groove therein extending along substantially an entire length of the first connecting edge;

b) a second confronting housing part non-identical to the first confronting housing part and having a second connecting edge with a protruding strip extending substantially an entire length thereof, a height of the protruding strip being less than a depth of the groove, the protruding strip engaging the groove to form a glue passage therebetween, the glue passage having a plurality of injection ports and an outlet, the glue passage defining two glue injection paths; and, c) glue located in the glue passage to seal the first and second confronting housing parts so as to prevent water leakage therebetween.

2. The sealed, water-proof housing of claim 1 wherein the first housing part has a notch, such that the first connecting edge and the associated groove extend around the notch and further comprising an electric connecting device having spaced apart front and rear clamping sheets located in the notch such that at least a portion of the rear clamping sheet engages the groove of the first housing part.

3. The sealed, water-proof housing of claim 2 further comprising spaced apart stop end faces on the protruding strip on the second confronting housing part, wherein the rear clamping sheet of the electric connecting device is located between the stop end faces.

4. The sealed, water-proof housing of claim 2 wherein the electrical connecting device has an input terminal and an output terminal accessible from externally of the housing.

* * * * *